(12) United States Patent
Zhu et al.

(10) Patent No.: US 8,664,054 B2
(45) Date of Patent: Mar. 4, 2014

(54) METHOD FOR FORMING SEMICONDUCTOR STRUCTURE

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/381,014

(22) PCT Filed: Apr. 18, 2011

(86) PCT No.: PCT/CN2011/072961
§ 371 (c)(1),
(2), (4) Date: May 3, 2012

(87) PCT Pub. No.: WO2012/100463
PCT Pub. Date: Aug. 2, 2012

(65) Prior Publication Data
US 2012/0264262 A1 Oct. 18, 2012

(30) Foreign Application Priority Data

Jan. 30, 2011 (CN) .......................... 2011 1 0033687

(51) Int. Cl.
*H01L 21/336* (2006.01)
(52) U.S. Cl.
USPC ........... 438/197; 438/229; 438/154; 438/285; 438/300; 438/322; 438/299; 257/402; 257/77; 257/288; 257/369; 257/E21.409
(58) Field of Classification Search
USPC .......... 438/322, 197, 154, 285, 300; 257/408, 257/77, 369
See application file for complete search history.

(56) References Cited

U.S. PATENT DOCUMENTS

| | | | |
|---|---|---|---|
| 2005/0090066 A1* | 4/2005 | Zhu et al. | 438/300 |
| 2006/0160317 A1* | 7/2006 | Zhu et al. | 438/322 |
| 2007/0122984 A1* | 5/2007 | Zhu et al. | 438/285 |
| 2008/0261355 A1* | 10/2008 | Goktepeli et al. | 438/154 |
| 2008/0286916 A1* | 11/2008 | Luo et al. | 438/197 |
| 2009/0001476 A1* | 1/2009 | Pei | 257/369 |

(Continued)

FOREIGN PATENT DOCUMENTS

CN 101840862 A 9/2010

OTHER PUBLICATIONS

International Preliminary Report on Patentability issued Jul. 30, 2013 for PCT application No. PCT/CN2011/072961.

*Primary Examiner* — Jerome Jackson, Jr.
*Assistant Examiner* — Bo Fan
(74) *Attorney, Agent, or Firm* — Enshan Hong; VLP Law Group LLP

(57) ABSTRACT

The invention relates to a method for forming a semiconductor structure, comprising: providing a semiconductor substrate which comprises a dummy gate formed thereon, a spacer surrounding the dummy gate, source and drain regions formed on two sides of the dummy gate, respectively, and a channel region formed in the semiconductor substrate and below the dummy gate; removing the dummy gate to form a gate opening; forming a stressed material layer in the gate opening; performing an annealing to the semiconductor substrate, the stressed material layer having tensile stress characteristics during the annealing; removing the stressed material layer in the gate opening; and forming a gate in the gate opening. By the above steps, the stress memorization technique can be applied to the pMOSFET.

12 Claims, 7 Drawing Sheets

(56) References Cited

U.S. PATENT DOCUMENTS

| | | | |
|---|---|---|---|
| 2009/0050942 A1* | 2/2009 | Liu et al. ........................ 257/288 |
| 2010/0059764 A1* | 3/2010 | Luo et al. ........................ 257/77 |
| 2010/0230765 A1* | 9/2010 | Quek et al. ..................... 257/408 |
| 2011/0256683 A1 | 10/2011 | Zhu et al. |

* cited by examiner

US 8,664,054 B2

METHOD FOR FORMING SEMICONDUCTOR STRUCTURE

CROSS REFERENCE TO RELATED APPLICATION

This application is a National Phase application of PCT Application No. PCT/CN2011/072961, filed on Apr. 18, 2011, entitled "method for forming semiconductor structure", which claimed priority to Chinese Application No. 201110033687.5, filed on Jan. 30, 2011. Both the PCT Application and the Chinese Application are incorporated herein by reference in their entireties.

FIELD OF THE INVENTION

This invention relates to a field of semiconductor technology, and particularly to a method for forming a semiconductor structure.

BACKGROUND OF THE INVENTION

Rapid development of the integrated circuit technique greatly benefits from the continuous reduction of the length of the channel region of the field-effect device, and at present, the length of the channel region can be shortened to the level of deep submicron and even nanometer. However, a further reduction of the length of the channel region is limited by a number of factors, and this is due to the issues of the processing capacity and the device physical effects (e.g., the short channel region effects). Therefore, in order to improve the performances of the device and the circuit, and further exert the potential of the semiconductor material and the device structure, other technical measures which are more effective shall be taken.

Currently, a technical measure widely recognized as effective is focused on the improvement of the semiconductor carrier mobility. In the metal semiconductor Field Effect Transistor (FET), increasing the carrier mobility in the channel region and reducing the length of the channel region achieve similar effects, and both can greatly increase the device driving current, thereby improving the device working speed. In addition, increasing the carrier mobility is also required to improve the short channel region effects: when the length of the channel region is reduced to about 30 nm or less, a very strong electric field will be generated in the channel region, and under the strong electric field, the mobility decreases and the saturation current drops greatly. Therefore, it is important either for the common device or for the short channel device to increase the carrier mobility in the channel region.

It is known that the carrier mobility of the semiconductor material can be increased by applying a stress to the FET. When the stress is applied to the FET, the electron mobility can be increased by a tensile stress, and the hole mobility can be increased by a compressive stress. The technique of applying a press to the FET is referred to as stress engineering.

A Stress Memorization Technique (SMT) has been set forth to apply a stress to the channel region of the FET. Specifically, referring to FIG. 1, a transistor 100 is formed on a semiconductor substrate 102, and the transistor 100 comprises a gate 106, a gate dielectric layer 110, a gate spacer 112, a source/drain 108, a channel region 114 and a Shallow Trench Isolation (STI) structure 104. The surface of the transistor 100 is covered with a stress silicon nitride layer 116, so that the stress silicon nitride layer 116 applies a stress to the channel region 114. After that, the transistor is annealed so that the stress is memorized in the channel region 114, and then the stress silicon nitride layer 116 is removed.

The main problem of the above existing SMT method is that the nitride material only can provide a simplex tensile stress under the high temperature, thus the above method merely can generate a simplex tensile stress in the channel region. As a result, the existing SMT method can only be applied to the n-type FET, and is impossible to be applied to the p-type FET. Unfortunately, the performance of the p-type FET is generally a key to restrict the device performance. In silicon, the hole mobility is about 2.5 times less than the electron mobility, and thus in the integrated circuit, the maximum working frequency and speed are obviously more restricted by the performance of the p-type FET.

Therefore, a SMT method that can be applied to the p-type FET is required.

SUMMARY OF THE INVENTION

In order to solve the above problem, the invention provides a method for forming a semiconductor structure, so that the SMT can be applied to the p-type FET.

The invention provides a method for forming a semiconductor structure, comprising:

providing a semiconductor substrate which comprises a dummy gate formed thereon, a spacer surrounding the dummy gate, source and drain regions formed on two sides of the dummy gate, respectively, and a channel region formed in the semiconductor substrate and below the dummy gate;

removing the dummy gate to form a gate opening;

forming a stressed material layer in the gate opening;

performing an annealing to the semiconductor substrate, and the stressed material layer has tensile stress characteristics during the annealing;

removing the stressed material layer in the gate opening; and forming a gate in the gate opening Compared with the prior art, the invention has the following advantages:

By a combination of the gate replacement process and the SMT, a compressive stress can be generated and memorized in the channel region of the p-type FET after an annealing, by filling the gate opening with a material which has tensile stress characteristics under a high temperature, thereby increasing the hole mobility and improving the overall performance of the p-type FET. In addition, when a stressed material layer is applied in the gate opening, a significantly thicker stressed material layer may be used to enhance the stress generated in the channel region.

The gate replacement process according to the invention may comprise the following steps: forming a stop layer and a dielectric layer on the semiconductor substrate in sequence, performing Chemical Mechanical Polishing (CMP) on the dielectric layer so that it stops on the stop layer, and exposes the stop layer on the top of a dummy gate; removing the exposed stop layer; and removing the dummy gate. The advantage of the steps of the above process is that the dielectric layer formed on the semiconductor substrate plays a role of supporting and reinforcing the gate spacer, and suppresses the stress generated by the stressed material in the gate opening from being released at the gate spacer, which is beneficial to the enhancement of the stress generated in the channel region.

In the step of providing the semiconductor substrate, a gate dielectric layer may be provided between the dummy gate and the semiconductor substrate, so that the gate dielectric layer is included in the gap gate formed in the subsequent step. An initial structure having the gate dielectric layer can achieve a smoother interface between the gate and the channel region. In addition, the gate dielectric layer can play a role of protecting the channel region in the gate replacement process, which is beneficial to the reduction of the negative influence on the channel region caused during a removal of the dummy gate, and it also can serve as an etching stop layer when the dummy gate and the material in the channel region lack etching selectivity or the etching selectivity is not enough.

Between the steps of removing the dummy gate and forming the stressed material layer or between the steps of removing the stressed material layer and forming the gate, the method according to the invention may further comprise forming a high-K dielectric layer. This provides a way of combining the method according to the invention with the high-K metal gate process. Accordingly, for the device that requires improving its performance using the gate replacement technique, the SMT process can be applied without significantly increasing the process complexity and the cost, so that a stress is introduced into the transistor channel region, and the device performance is greatly improved while the manufacturing cost is minimized.

By combining an Super Steep Retrograde Well (SSRW) process, an SSRW implantation region is generated below the channel region. This can suppress the device short-circuit and further improve the device performance.

An additional stress may be introduced into the channel region of the transistor by forming a source/drain of the transistor with a material having stress characteristics with respect to the semiconductor substrate, which is beneficial to the further improvement of the hole mobility in the channel region.

These and other features, aspects and advantages of the invention will be understood more easily with reference to the following descriptions and the claims.

DETAILED DESCRIPTION OF THE EMBODIMENTS

Figure 1:
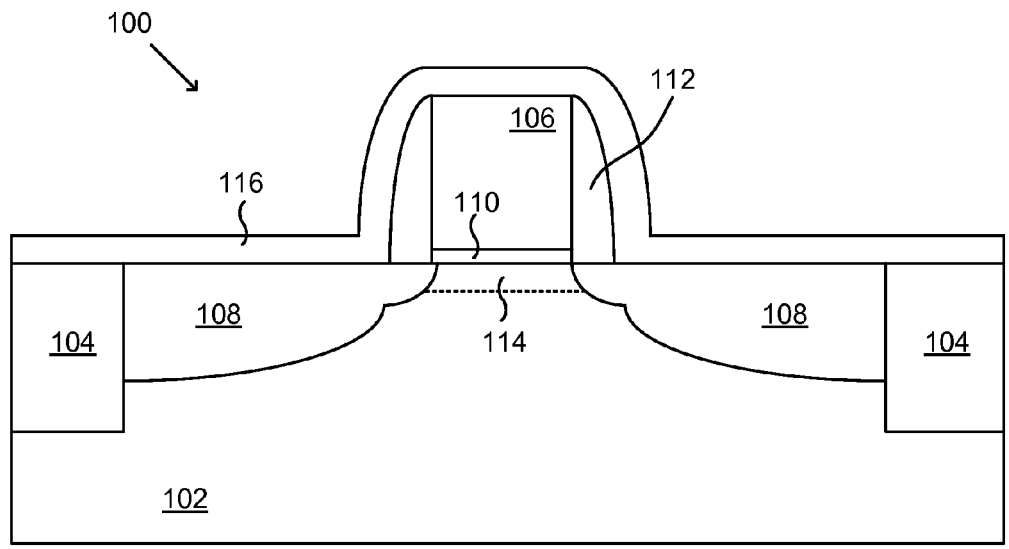
FIG. 1 illustrates a schematic view illustrating a semiconductor structure in the prior art.

The invention is described as follows through the embodiments illustrated in the drawings. It shall be appreciated that these embodiments are just exemplary rather than limiting the scope of the invention. The drawings illustrate the cross-section views of a semiconductor structure according to the embodiments of the invention. The drawings are not drawn to scale, in which some details are enlarged for clarity while some details may be omitted. The shapes of various regions and layers illustrated in the drawings as well as their relative sizes and positional relations are just exemplary, and the actual conditions may deviate due to the manufacturing tolerances or technical limitations. In addition, upon the actual requirement, a person skilled in the art may design regions/layers of different shapes, sizes and relative positions. Moreover, a structure described below in which a first feature is "on" a second feature, may include an embodiment where the first and second features directly contact with each other, or an embodiment where another feature is formed between the first and second features so that the first and second features may not directly contact with each other. Furthermore, the term "vertical" means that a difference between 90° and an included angle between two planes is within a range allowed by the process or procedure.

The invention provides examples of various specific processes and materials, but a person skilled in the art can realize the availability of other processes and/or usage of other materials. In addition, the descriptions of known structures and techniques are omitted in the following descriptions to prevent the concepts of the invention being unnecessarily confused.

Referring to FIGS. 2 to 13, which illustrate the schematic cross-section views of a semiconductor structure at respective stages according to one embodiment of the invention.

Figure 2:
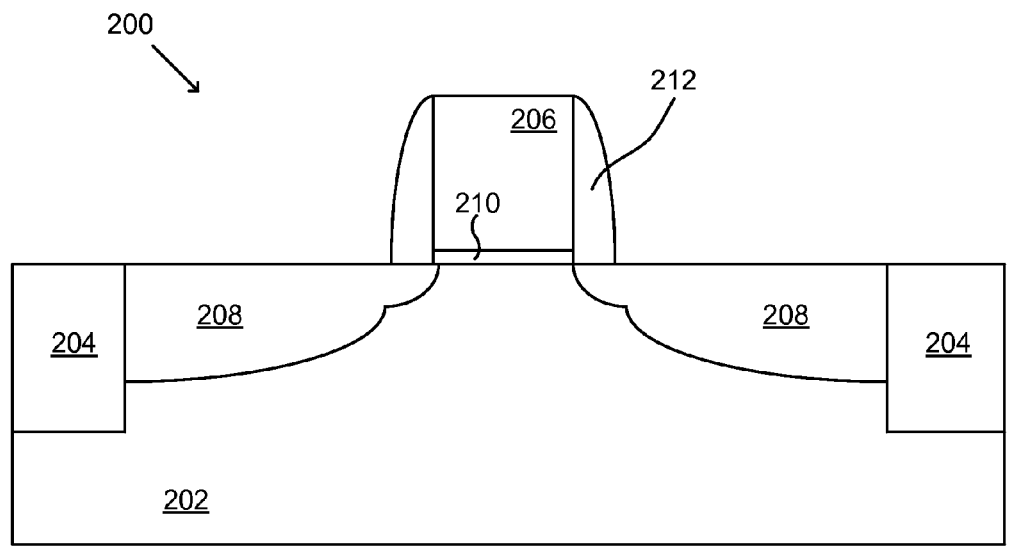
FIGS. 2 to 13 illustrate the schematic cross-section views of a semiconductor structure at respective stages according to one embodiment of the invention.

Referring to FIG. 2, as illustrated therein, an initial structure for a manufacturing method according to one embodiment of the invention is a transistor 200, which may be, but not limited to, a p-type FET. The transistor 200 is formed in a semiconductor substrate 202, and comprises a source/drain 208, a dummy gate 206, a gate dielectric layer 210, a spacer 212 surrounding the dummy gate 206, and a channel region 214 formed below the dummy gate 206 and in the semiconductor substrate 202.

In this embodiment, the semiconductor substrate 202 may comprise a silicon substrate. The semiconductor substrate 202 in other embodiments may be made of other basic semiconductor, such as germanium or diamond. Alternatively, the semiconductor substrate 202 may be made of a compound semiconductor, such as silicon carbide, silicon-germanium, silicon carbide germanium alloy, gallium arsenide, indium arsenide or indium phosphide. In addition, the semiconductor substrate 202 may optionally comprise an epitaxial layer and a Silicon On Insulator (SOI) structure. According to the design requirement known in the prior art, the semiconductor substrate 202 may comprise various doped configurations. Typically, the semiconductor substrate 202 may be, but not limited to, several hundreds of microns thick (e.g., about 400 to 800 microns). In case the substrate is a top semiconductor layer of the SOI structure, its thickness may be, but not limited to, about 3 to 70 microns. Many processes and materials for forming the transistor 200 are known to a person skilled in the art.

In this embodiment, the source/drain 208 may be formed by any technique known at present or to be developed in future. For example, the source/drain 208 may be formed by implanting impurity ions into the semiconductor substrate 202. Optionally, before the implantation for the source/drain 208, a halo implantation and an extension implantation may be performed to further improve the device performance. After that, the source/drain 208 has a portion extending below the gate, as illustrated in FIG. 2. For the transistor 200, a material to be implanted for the halo implantation is preferably arsenic or phosphorus, a material to be implanted for the extension implantation is preferably boron, boron bifluoride or indium, and a material to be implanted for the source/drain implantation is preferably boron bifluoride or boron. Particularly, the dummy gate 206 may be formed before or after the source/drain 208 depending on the selected process. In addition, the source/drain 208 may be made of a material the same as or different from that of the semiconductor substrate 202. Particularly, the source/drain 208 may be made of a material having stress characteristics with respect to the semiconductor substrate 202, so as to generate an additional stress in the channel region and further increase the hole mobility in the channel region. Preferably, in case the semiconductor substrate 202 is made of silicon, the source/drain 208 may be made of SiGe.

In this embodiment, the gate dielectric layer 210 is dispensable. As can be seen from the subsequent descriptions, a gate dielectric layer such as a high k dielectric layer may be formed in the subsequent steps. However, the initial structure having the gate dielectric layer can achieve a smoother interface between the gate and the channel region. In addition, the gate dielectric layer can play a role of protecting the channel region during a removal of the dummy gate, which is beneficial to the reduction of the negative influence on the channel region caused by the removal of the dummy gate, and it also can serve as an etching stop layer when the dummy gate and the channel region are made of a material lacking of etching selectivity or the etching selectivity thereof is not enough.

In this embodiment, the dummy gate 206, the gate dielectric layer 210 and the spacer 212 may be formed with any technique and material known at present or to be developed in future. Preferably, in case the semiconductor substrate 202 is made of silicon, the dummy gate 206 may be made of an insulating material or non-insulating material, such as polycrystalline silicon, polycrystalline silicon germanium, silicon nitride, silicon oxide or various metals. The spacer 212 may be a single layer structure or a multi-layer structure (i.e., the number of the spacers is more than one). Preferably, the spacer 212 may be made of nitride. The gate dielectric layer 210 preferably has a thickness of 3 to 5 nm, and a material thereof may be, but not limited to, nitride, oxide or a high-k dielectric layer.

In this embodiment, optionally, the transistor 200 is electrically isolated from other transistors on the semiconductor substrate 202 by a Shallow Trench Isolation (STI) structure 204.

To be noted, the transistor 200 may have other additional or modified structure upon the actual requirement, and it is not limited to the structure illustrated in FIG. 2. In addition, although the p-type FET 200 is taken as an example for the convenience of illustrating one embodiment of the method of the invention, the application scope of the invention is not limited to the p-type FET. The transistors or semiconductor structures existed at present or to be developed in future can also be applied under the teaching of the invention, in case they have specific structures corresponding to the embodiments of the invention and can be applied with the steps of the method of the invention and achieve substantially the same effects, so these transistors or semiconductor structures do not deviate from the protection scope of the invention.

In addition, although the transistor 200 illustrated in FIG. 2 has a finite boundary, a person skilled in the art will appreciate that this is for the convenience of description. In fact, the finite boundary is an open boundary, i.e., the transistor 200 and other semiconductor structures may be successively formed on one substrate without any boundary therebetween.

Figure 3:
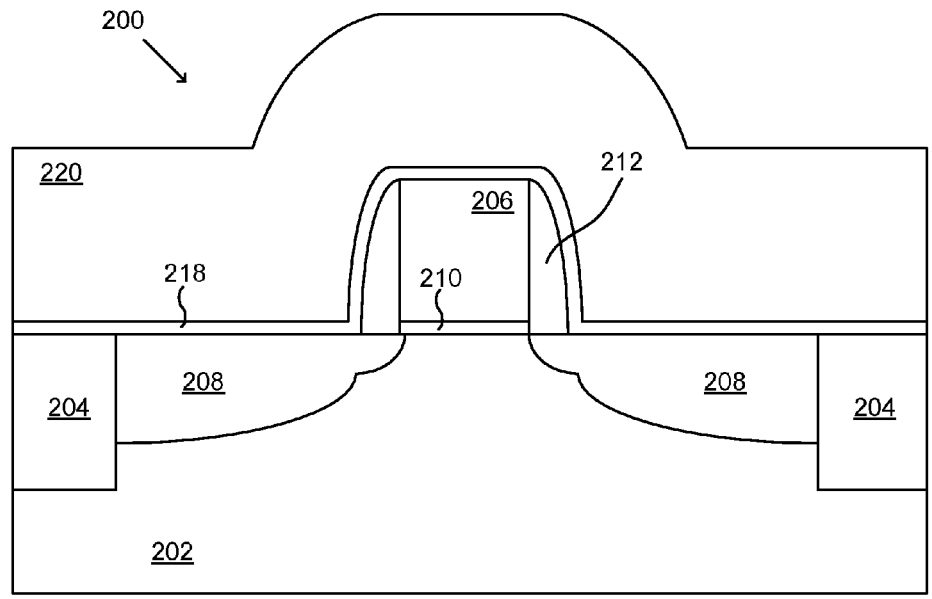

Referring to FIG. 3, as illustrated therein, a stop layer 218 and a dielectric layer 220 are formed on the transistor 200 in sequence. The "form" herein may include various material formation ways, for example but not limited to, PVD, CVD, ALD, PLD, MOCVD, PEALD, sputtering, evaporation or Molecular Beam Deposition (MBE), etc.

In this embodiment, the stop layer 218 preferably has a thickness of about 5 to 200 nm. The dielectric layer 220 shall have enough thickness for the subsequent Chemical Mechanical Polishing (CMP) process. The stop layer 218 may be made of but not limited to nitride. The dielectric layer 220 may be made of a material having etching selectivity over that of the stop layer 218. Particularly, in case the stop layer 218 is made of silicon nitride, the dielectric layer 220 is preferably made of silicon oxide.

Figure 4:
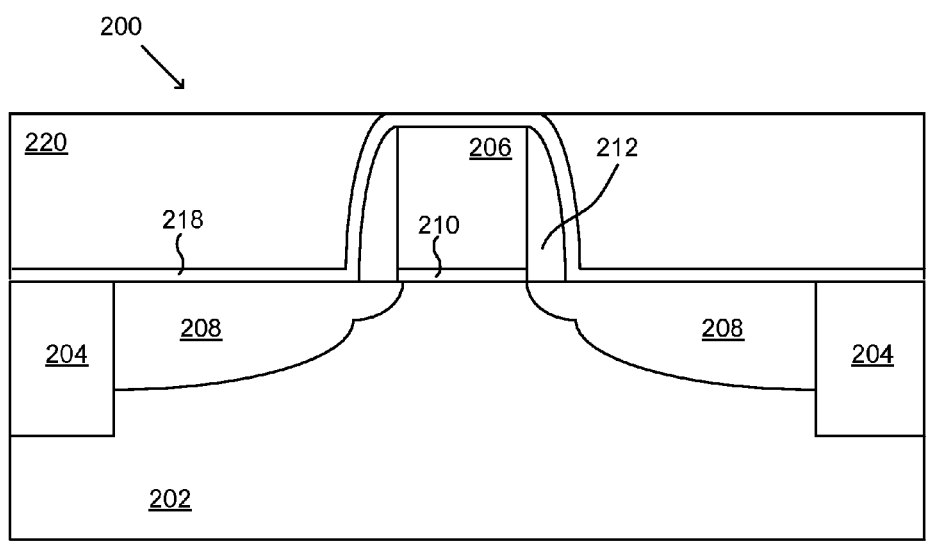

Referring to FIG. 4, as illustrated therein, the dielectric layer 220 is subjected to a CMP processing until it stops on the stop layer 218, so as to expose the stop layer 218 on the top of the dummy gate 206.

Figure 5:
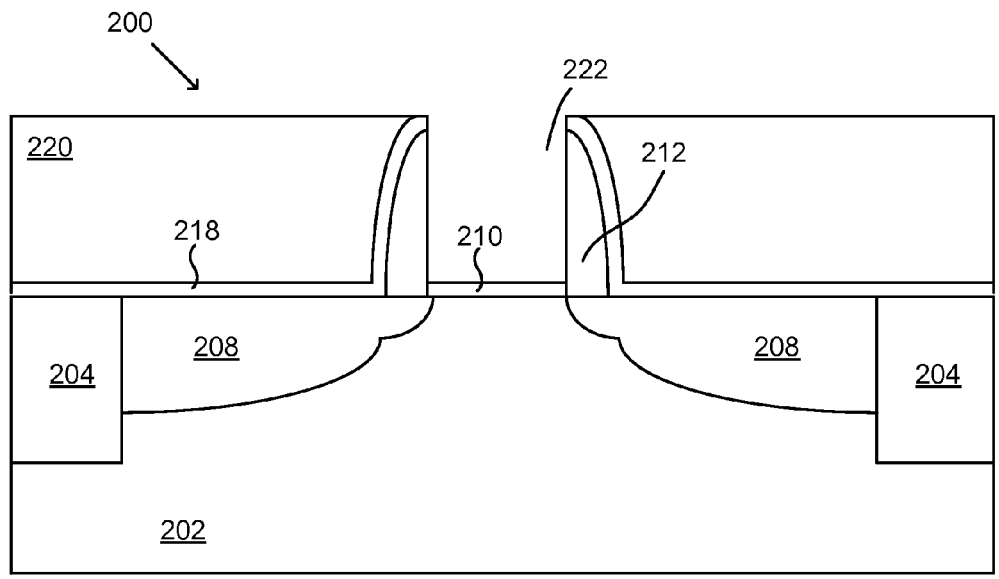

Referring FIG. 5, as illustrated therein, the dummy gate 206 is removed to form a gate opening 222. Specifically, with respect to the dielectric layer 220, the exposed stop layer 218 is selectively etched and removed. Next, with respect to the stop layer 218, the dielectric layer 220, the spacer 212 and the gate dielectric layer 210, the dummy gate 206 is selectively etched and removed to form the gate opening 222. The process of removing the dummy gate 206 comprises, but not limited to, the anisotropic Reactive Ion Etching (RIE). In one embodiment, the stop layer 218 and the gate spacer 212 are made of nitride, the dielectric layer 220 and the gate dielectric layer 210 are made of oxide, and the dummy gate 206 is made of polycrystalline silicon, then the process of removing the dummy gate 206 is to selectively etch the polycrystalline silicon with respect to the nitride and the oxide.

Figure 6:
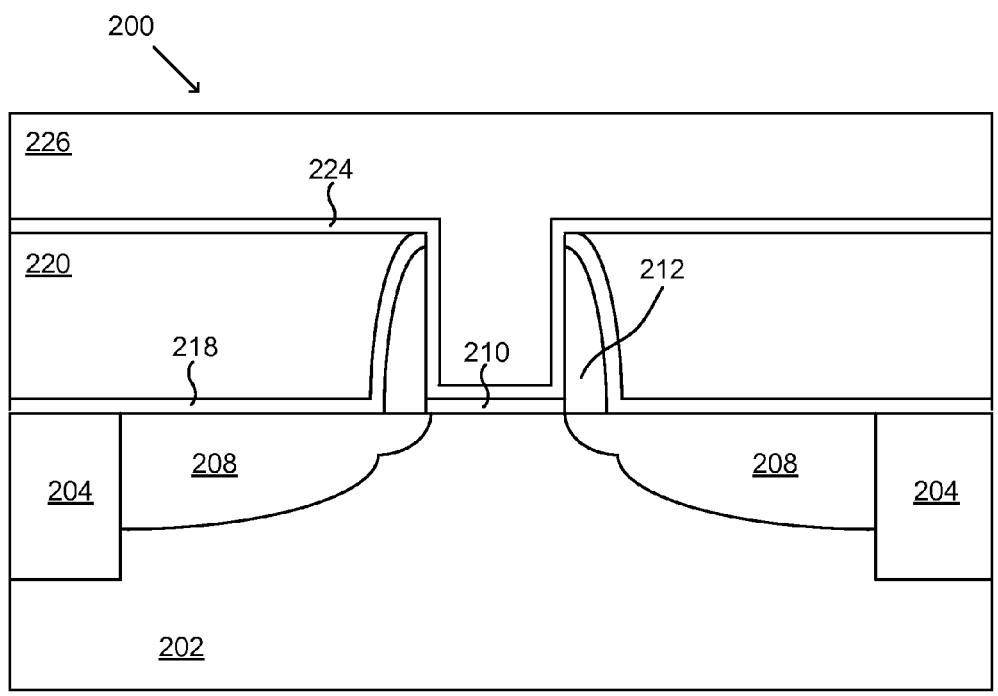

Referring to FIG. 6, as illustrated therein, preferably, a high-k dielectric layer 224 is conformally deposited on the entire surface of the device. The high-k dielectric layer 224 may be made of, but not limited to, HfO2, HfSiO, HfSiON, HfTaO, HfTiO, HfZrO, Al2O3, La2O3, ZrO2 or LaAlO, and its thickness is preferably about 1 to 3 nm. In addition, the total thickness of the high-k dielectric layer 224 and the gate dielectric layer 210 is preferably less than 20 nm. In this range of thickness, the stress generated by the stressed material layer can be well transmitted into the channel region.

Next, a stressed material layer 226 which has tensile stress characteristics during an annealing is formed in the gate opening 222. The stressed material is a kind of material which can introduce stress in the semiconductor substrate. A stressed material having tensile stress characteristics under a high temperature is used, so that a compressive stress is generated in the channel during a high temperature annealing, and memorized in the channel by the high temperature annealing. The annealing temperature should be higher than 800 ° C. Therefore, the stressed material layer 226 may be made of any stressed material having tensile stress characteristics under a high temperature. For example, the stressed material layer 226 may be made of nitride comprising the nitride having a tensile stress or a compressive stress, or having no stress under the normal temperature, which will generate a strong tensile stress under a high temperature (>800° C.). In addition, the gate opening 222 formed after removal of the dummy gate has a certain height, and the stressed material layer 226 may be significantly higher than the gate opening 222. Therefore, the stressed material layer 226 formed according to the method of the invention may be significantly thicker, which is beneficial to achieving a good stress generation effect in the channel region.

To be noted, the step of depositing the high-k dielectric layer 224 is optional. The step of depositing the high-k dielectric layer 224 is added to describe a way of combining the invention with the High-K Metal Gate (HKMG) process.

In this embodiment, depositing the high-k dielectric layer 224 is to combine the invention with the HKMG structure. This is because the channel region of the device in which the stress needs to be generated to increase the carrier mobility is generally short, and the HKMG process often needs to be combined to further improve the device performance. For the device not requiring the HKMG process, the requirement of increasing the carrier mobility is generally not high, and more attention is paid to the cost increment caused by the added process step. Thus, in the actual applications, the invention often needs to be combined with the HKMG process, i.e., to deposit the high-k dielectric layer 224 and subsequently fabricate the metal gate. However, these two steps are dispensable for the invention. For example, the high-k dielectric layer 224 may not be deposited, and the stressed material layer 226 may be directly deposited to fill the gate opening 222, the stressed material layer 226 being directly in contact with the gate dielectric layer 210.

In addition, the sequence of the step of depositing the high-k dielectric layer 224 in the manufacturing process may be changed, so as to obtain advantages at different aspects and further improve the device performance. The deposition of the high-k dielectric layer 224 may be earlier than that of the stressed material layer 226, as illustrated in FIG. 6. The advantage is that the high-k dielectric layer 224 having a good flatness can be acquired. The deposition of the high-k dielectric layer 224 may also follow the removal of the stressed material layer 226 (the stressed material layer 226 needs to be removed, as described later), so that the stress generated in the channel region will not be influenced by the thickness of the high-k dielectric layer 224, and such thickness can be adjusted independently upon the actual requirement. Moreover, the high-k dielectric layer 224 may also be deposited before forming the dummy gate. In conclusion, according to the HKMG process existed at present or to be developed in future, a person skilled in the art can adjust the specific way of combing the invention with the HKMG process upon the actual requirement.

Referring to FIG. 6, next, an annealing is performed to activate the dopants and memorize the stress generated by the stressed material layer 226 in the channel region of the transistor. During the annealing, the stressed material layer 226 generates a tensile stress, thus a compressive stress can be generated in the channel region and memorized during the annealing. In addition, the dielectric layer 220 and the stop layer 218 play a role of supporting and reinforcing the gate spacer 212, and suppress the stress generated by the stressed material in the gate opening from being released at the gate spacer, which is beneficial to the enhancement of the compressive stress generated in the channel region.

Figure 7:
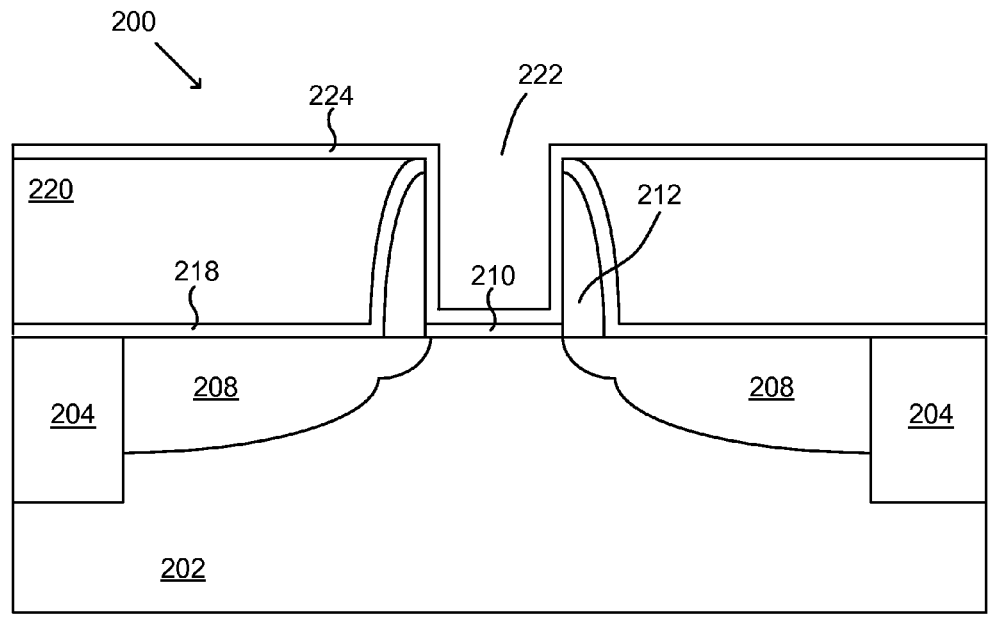

Referring to FIG. 7, as illustrated therein, the stressed material layer 226 is removed. A dry or wet etching may be performed to remove the stressed material layer 226. In case the high-k dielectric layer 224 is formed before the stressed material layer 226, the selective etching is performed with respect to the high-k dielectric layer 224. In case the high-k dielectric layer 224 is formed after the stressed material layer 226 or it is not used, the selective etching is performed with respect to the dielectric layer 220, the stop layer 218 and the gate spacer 212.

Figure 8:
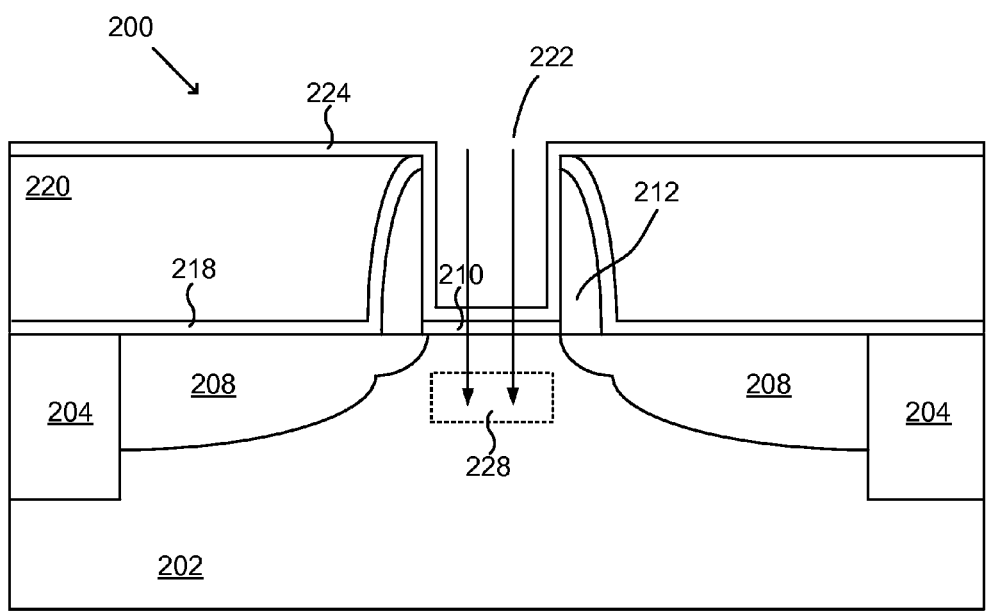

Referring to FIG. 8, as illustrated therein, optionally an Super-Steep-Retrograded Well (SSRW) ion implantation is performed, so as to suppress the device short-circuit and further improve the device performance. The material to be implanted is preferably arsenic, boron or antimony. In that case, the dielectric layer 220 and the stop layer 218 actually serve as a mask, so that the SSRW ion implantation becomes a self-aligned implantation.

To be noted, the step of performing the SSRW ion implantation is also optional. Generally, the channel region in which the stress is generated to increase the carrier mobility is short, and an SSRW ion implantation often needs to be performed to further improve the device performance. For the device not requiring the SSRW ion implantation, the requirement of increasing the carrier mobility is generally not high, and more attention is paid to the cost increment caused by the added process step. Thus, in the actual applications, the invention often needs to be combined with the SSRW ion implantation process. However, this step is dispensable. For example, the step of performing SSRW ion implantation as illustrated in FIG. 8 may be omitted, and subsequent steps may be performed directly.

In addition, the sequence of the step of performing SSRW ion implantation in the manufacturing process may be changed, so as to obtain advantages at different aspects and further improve the device performance. The SSRW ion implantation may be performed following the removal of the stressed material layer 226, as illustrated in FIG. 8, and the SSRW ion implantation may also be performed before the stressed material layer 226 being deposited. Similarly, the SSRW ion implantation may be performed before or after the deposition of the high-k dielectric layer 224.

Still referring to FIG. 8, next, a laser annealing is performed to activate the SSRW dopants to form an SSRW doped region 228.

Figure 9:
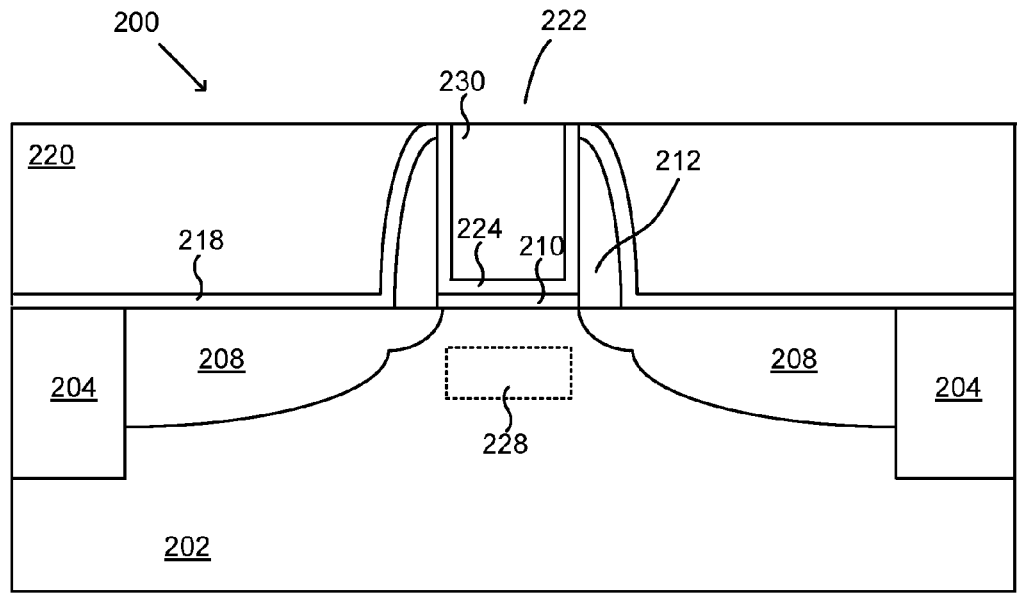

Referring to FIG. 9, as illustrated therein, a gate 230 is formed. The gate is made of one or more materials selected from a group consisting of Ti, Co, Ni, Al and W, and alloys thereof, metal silicide, polycrystalline silicon and polycrystalline germanium silicon. When the HKMG process is applied, the gate is preferably made of metal. The metal gate 230 may be manufactured by several known metal gate forming processes. For example, the gate opening 22 and the entire surface of the device may be filled with metal, and then a CMP is performed until the top of the dielectric layer 220 is exposed. The filled metal may comprise work function tuning metal, such as TiN, TiAlN, TaN, TaAlN or TaC, etc. After the CMP being performed, the high-k dielectric layer 224 on the upper surface of the device may be partially or completely polished. FIG. 9 illustrates a situation that the high-k dielectric layer 224 on the upper surface of the device is completely polished.

Next, any process flow known currently or to be developed in future for forming an conductive contact is performed. Preferably, in order to maximally reduce and avoid the negative influence on the metal silicide caused by the high temperature annealing during the stress memorization, and simplify the process flow so far as possible, the process steps for forming an conductive contact as illustrated in FIGS. 10 to 13 may be performed.

Figure 10:
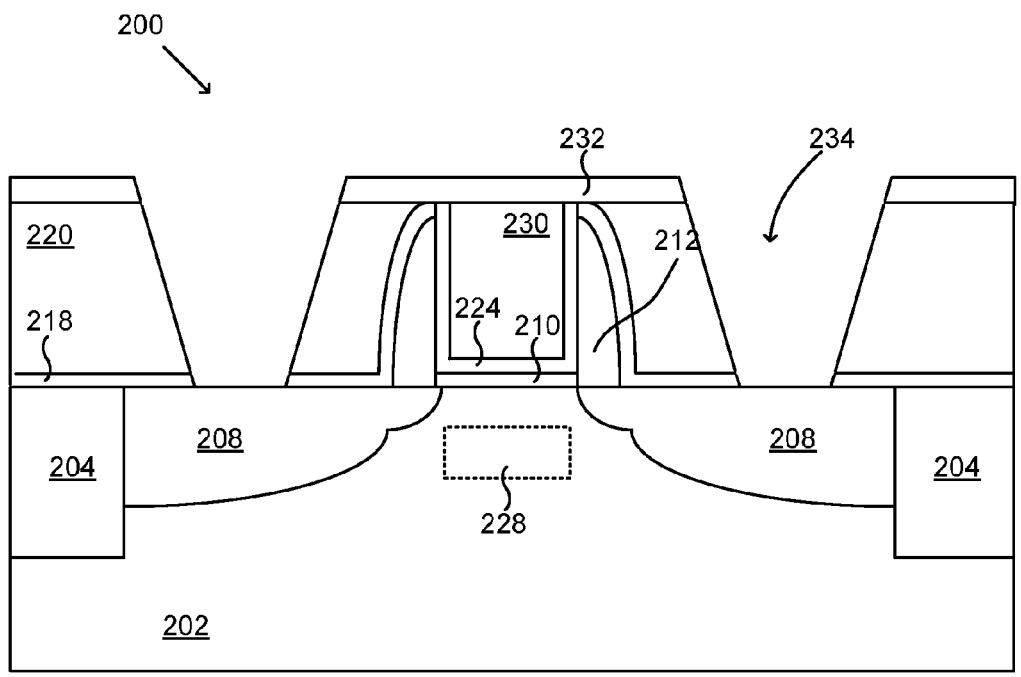

Referring to FIG. 10, as illustrated therein, an insulating layer 232 is deposited, and then contact holes 234 with substantially inclined edges are formed. The insulating layer 232 is preferably made of nitride and has a thickness of about 10 to 20 nm. The contact holes 234 penetrate all the dielectric layers on the source/drain 208 and reach the source/drain 208.

Figure 11:
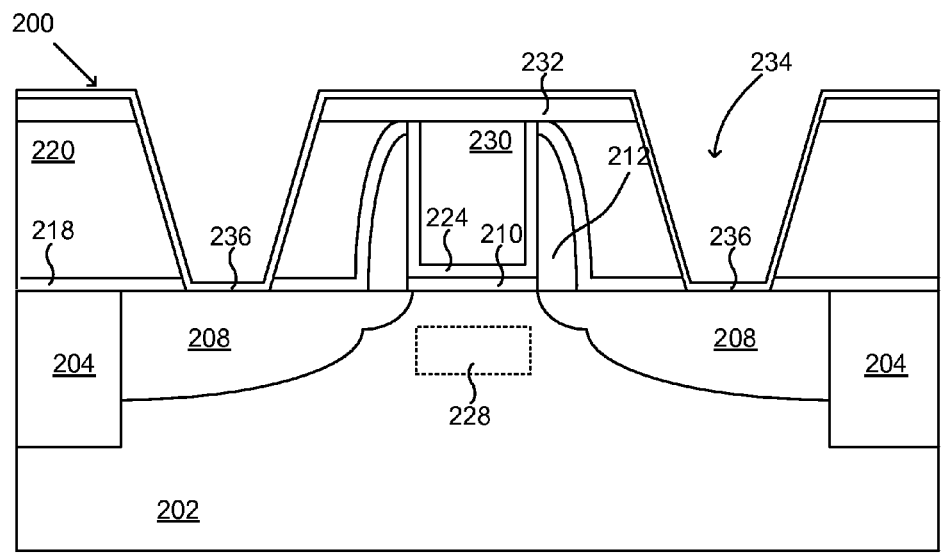

Referring to FIG. 11, as illustrated therein, a metal layer 236 is deposited in the contact holes 240. The metal layer 236 is made of one or more materials selected from a group consisting of Pt, Ti, Co, Cu and Ni, or alloys thereof. Preferably, the metal layer is made of NiPt.

Figure 12:
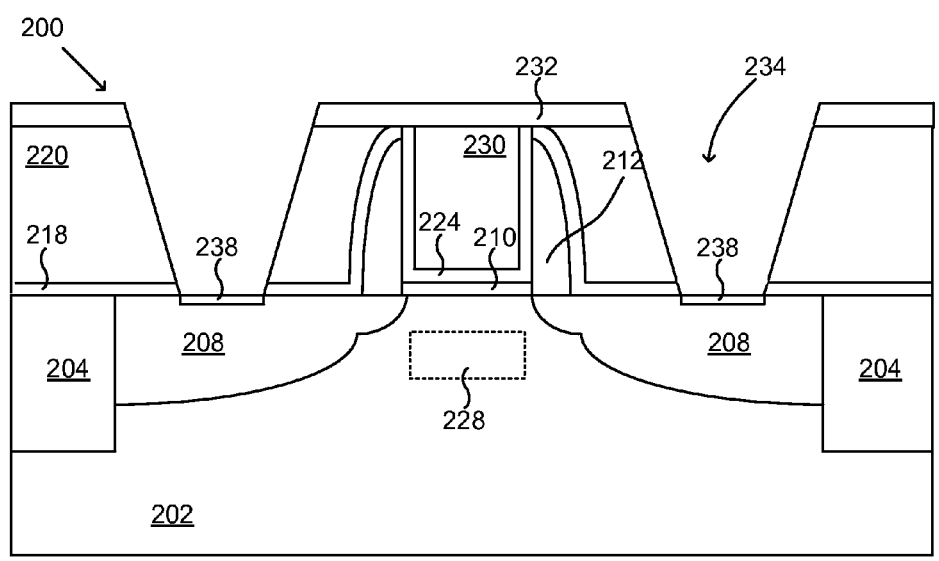

Referring to FIG. 12, as illustrated therein, an annealing is performed to form a contact layer 238, and then the unreacted meal is removed. In case the deposited metal layer 236 is made of NiPt, the annealing temperature is preferably about 250° C. to 500° C. to form NiSiPt, and then the unreacted NiPt is removed.

Figure 13:
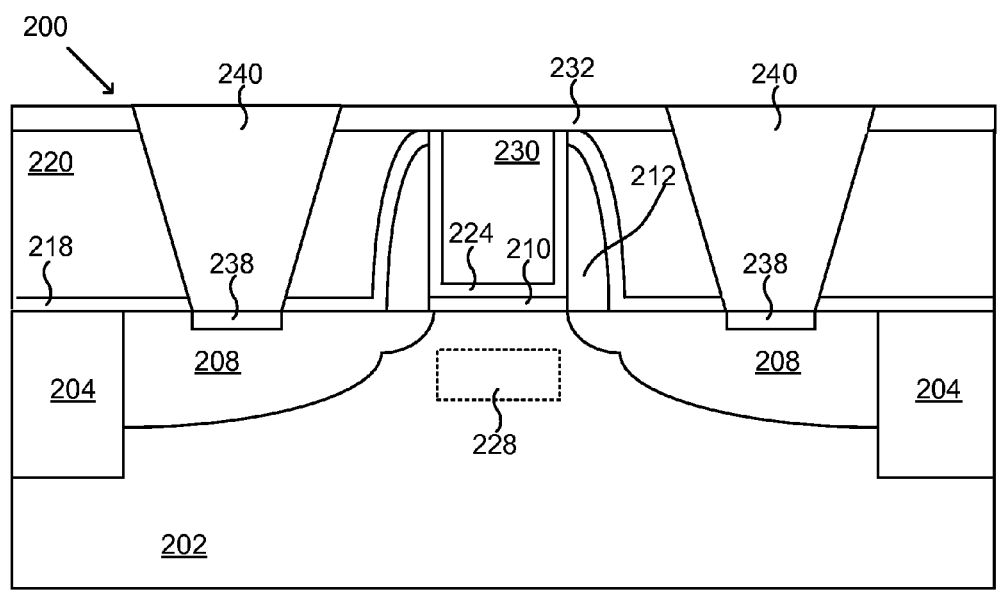

Referring to FIG. 13, as illustrated in FIG. 13, a metal is filled into the contact holes 240 to form an conductive contact. Any process known at present or to be developed in future may be adopted to form the conductive contact. In one embodiment, a conductive metal is deposited in the contact holes 240, and then a CMP is carried out until the top of the insulating layer 232 is exposed. The filled conductive metal is preferably tungsten, because tungsten has a low resistivity and it is easy to be filled. The contact holes 240 are not necessarily full of the conductive metal, and they may be partially filled, i.e., only a portion at the bottom of the contact holes 240 joining with the source and drain is filled with the conductive metal. Preferably, a portion of the conductive metal joining with the source and drain comprises tungsten. The conductive contact may be formed in other shapes, e.g., with a vertical edge, and not limited to the specifc shape illustrated in FIG. 13.

Although the above embodiments are described by taking the stressed material having tensile stress characteristics under a high temperature and the p-type FET as examples, a person skilled in the art will appreciate that when a stressed material having compressive stress characteristics under a high temperature is developed in future, it also can be applied to the invention to generate a compressive stress in the channel region of the n-type FET, and can achieve various beneficial effects produced by the above embodiments.

The process steps illustrated in the above embodiments may have different sequences. A person skilled in the art can design various modifications of the specific process steps, so as to achieve the functions substantially the same as those of corresponding steps in the above embodiments or obtain substantially the same effects, without deviating from the substance of the invention. In addition, the invention provides examples of various specific processes and/or materials. However, a person skilled in the art will appreciate that the substitutive applications of other processes and/or materials obviously do not depart from the protection scope of the invention.

Meanwhile, the application scope of the invention is not limited to the processes, structures, manufacturing, compositions, means, methods and steps of the specific embodiments as described in the specification. According to the disclosure of the invention, a person skilled in the art will easily appreciate that when the processes, structures, manufacturing, compositions, means, methods or steps currently existed or to be developed in future are adopted to perform functions substantially the same as those of the corresponding embodiments described in the invention, or achieve substantially the same effects, a person skilled in the art can make applications of them according to the teaching of the invention, without departing from the protection scope of the invention.

What is claimed is:

1. A method for forming a semiconductor structure, comprising:
    providing a semiconductor substrate which comprises a dummy gate formed thereon, a spacer surrounding the dummy gate, source and drain regions formed on both sides of the dummy gate, respectively, and a channel region formed in the semiconductor substrate below the dummy gate;
    removing the dummy gate to form a gate opening;
    forming a stressed material layer in the gate opening, wherein the stressed material layer has tensile stress;
    performing an annealing to the semiconductor substrate, so that stress introduced by the stressed material layer can be memorized in the channel region;
    removing the stressed material layer in the gate opening; and
    forming a gate in the gate opening.

2. The method according to claim 1, wherein the step of removing the dummy gate comprises:
    forming a stop layer and a dielectric layer on the semiconductor substrate in sequence;
    performing Chemical Mechanical Polishing (CMP) on the dielectric layer to stop on the stop layer, so as to expose the stop layer on top of the dummy gate;
    removing the exposed stop layer; and
    removing the dummy gate.

3. The method according to claim 2, wherein:
    the substrate is made of silicon, the stop layer and the spacer are made of silicon nitride, and the dielectric layer is made of silicon oxide.

4. The method according to claim 1, wherein in the step of providing the semiconductor substrate, a gate dielectric layer is further provided between the dummy gate and the semiconductor substrate.

5. The method according to claim 1, wherein between the steps of removing the dummy gate and forming the stressed material layer, or between the steps of removing the stressed material layer and forming the gate, the method further comprises forming a high-K dielectric layer.

6. The method according to claim 5, wherein:
    when forming the high-K dielectric layer between the steps of removing the dummy gate and forming the stressed material layer, the method further comprises: between the steps of removing the dummy gate and forming the high-K dielectric layer, or between the steps of forming the high-K dielectric layer and forming the stressed material layer, forming an Super Steep Retrograde Well (SSRW) in the semiconductor substrate; or
    when forming the high-K dielectric layer between the steps of removing the stressed material layer and forming the gate, the method further comprises: between the steps of removing the stressed material layer and forming the high-K dielectric layer, or between the steps of forming the high-K dielectric layer and forming the gate, forming an SSRW in the semiconductor substrate.

7. The method according to claim 1, wherein the gate is made of one or more materials selected from a group consisting of Ti, Co, Ni, Al and W, and alloys thereof, metal silicide, polycrystalline silicon and polycrystalline germanium silicon.

8. The method according to claim 1, wherein the dummy gate is made of one or more materials selected from a group consisting of polycrystalline silicon, polycrystalline germanium silicon, silicon nitride, silicon oxide and metals.

9. The method according to claim 1, wherein:
    the source and drain regions are formed of a material which applies stress to the substrate.

10. The method according to claim 1, wherein after forming the gate, the method further comprises:
    forming contact holes on the source and drain regions;
    forming a metal layer in the contact holes;
    performing an annealing to form a contact layer in the contact holes; and
    filling the contact holes with a conductive metal to form an conductive contact with the source and drain regions.

11. The method according to claim 10, wherein the metal layer is made of one or more materials selected from the group consisting of Pt, Ti, Co, Cu, Ni, and alloys thereof.

12. The method according to claim 10, wherein the conductive contact with the source and drain regions comprises tungsten.

* * * * *